United States Patent
Gu et al.

(10) Patent No.: US 12,249,754 B2
(45) Date of Patent: Mar. 11, 2025

(54) DISPLAY PANEL, METHOD FOR MANUFACTURING DISPLAY PANEL, AND ELECTRONIC DEVICE

(71) Applicant: BOE Technology Group Co., Ltd., Beijing (CN)

(72) Inventors: Penghao Gu, Beijing (CN); Song Zhang, Beijing (CN); Zhengdao Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 313 days.

(21) Appl. No.: 17/926,624

(22) PCT Filed: Nov. 15, 2021

(86) PCT No.: PCT/CN2021/130636
§ 371 (c)(1),
(2) Date: Nov. 21, 2022

(87) PCT Pub. No.: WO2022/127465
PCT Pub. Date: Jun. 23, 2022

(65) Prior Publication Data
US 2023/0208012 A1    Jun. 29, 2023

(30) Foreign Application Priority Data
Dec. 18, 2020 (CN) .......................... 202011505991.0

(51) Int. Cl.
*H01Q 1/24* (2006.01)
*H01Q 1/38* (2006.01)
(Continued)

(52) U.S. Cl.
CPC .......... *H01Q 1/243* (2013.01); *H02J 50/005* (2020.01); *H02J 50/10* (2016.02); *H04B 5/79* (2024.01);
(Continued)

(58) Field of Classification Search
CPC .......... H01Q 1/22; H01Q 1/2291; H01Q 1/24; H01Q 1/243; H01Q 17/00; H01Q 17/004;
(Continued)

(56) References Cited

U.S. PATENT DOCUMENTS 10,586,648 B2    3/2020 Lee et al.
2014/0328084 A1*  11/2014 Chuang .................. H01Q 1/243
                                                    361/767
(Continued)

FOREIGN PATENT DOCUMENTS

CN          102737582 A    10/2012
CN          102749771 A    10/2012
(Continued)

OTHER PUBLICATIONS

International Search Report and Written Opinion mailed on Feb. 17, 2022, in corresponding PCT/CN2021/130636, 8 pages.
(Continued)

*Primary Examiner* — Thai Pham
(74) *Attorney, Agent, or Firm* — XSENSUS LLP (57) ABSTRACT

The present disclosure provides a display panel, a method for manufacturing the display panel, and an electronic device. The display panel includes a display functional layer, an antenna functional layer on a back side of the display functional layer, and a magnetic field absorption layer on a side, close to the display functional layer, of the antenna functional layer, or on a side, away from the display functional layer, of the antenna functional layer. At least one antenna structure of the antenna functional layer includes a first substrate, a power receiving coil on a side, away from the display functional layer, of the first substrate, and a first flat layer on a side, away from the first substrate, of the power receiving coil. An orthographic projection of the power receiving coil on a reference plane is within an
(Continued)

orthographic projection of the magnetic field absorption layer on the reference plane.

20 Claims, 6 Drawing Sheets (51) Int. Cl.
| | |
|---|---|
| H02J 50/00 | (2016.01) |
| H02J 50/10 | (2016.01) |
| H04B 5/79 | (2024.01) |
| H10K 59/10 | (2023.01) |
| H10K 59/12 | (2023.01) |
| H10K 59/131 | (2023.01) |
| H10K 71/00 | (2023.01) |
| H10K 102/00 | (2023.01) |

(52) U.S. Cl.
CPC ....... *H10K 59/1201* (2023.02); *H10K 59/131* (2023.02); *H10K 71/00* (2023.02); *H10K 2102/311* (2023.02)

(58) Field of Classification Search
CPC ... H01Q 1/38; H01Q 7/00; H02J 50/00; H02J 50/005; H02J 50/10; H10K 59/00; H10K 59/10; H10K 59/127; H10K 59/131; H10K 2102/311
See application file for complete search history.

(56) References Cited

U.S. PATENT DOCUMENTS

| | | | |
|---|---|---|---|
| 2015/0334886 A1* | 11/2015 | Jang | ........................ B32B 7/06 156/60 |
| 2016/0012956 A1 | 1/2016 | Yang et al. | |
| 2018/0268988 A1 | 9/2018 | Lee et al. | |
| 2018/0315534 A1* | 11/2018 | Jang | ........................ H02J 50/70 |
| 2020/0266542 A1* | 8/2020 | Mu | ........................ H10K 59/00 |

FOREIGN PATENT DOCUMENTS

| | | |
|---|---|---|
| CN | 102751309 A | 10/2012 |
| CN | 104871657 A | 8/2015 |
| CN | 110082976 A | 8/2019 |
| CN | 209843948 U | 12/2019 |
| CN | 111399286 A | 7/2020 |
| CN | 111477123 A | 7/2020 |
| CN | 111508340 A | 8/2020 |
| CN | 212033026 U | 11/2020 |
| CN | 112635528 A | 4/2021 |

OTHER PUBLICATIONS

Office Action issued on Mar. 1, 2022, in corresponding Chinese patent Application No. 202011505991.0, 15 pages.
Office Action issued on Aug. 15, 2022, in corresponding Chinese patent Application No. 202011505991.0, 16 pages.

* cited by examiner

DISPLAY PANEL, METHOD FOR MANUFACTURING DISPLAY PANEL, AND ELECTRONIC DEVICE

CROSS-REFERENCE

The present disclosure is a national phase entry under 35 U.S.C. § 371 of International Application No. PCT/CN2021/130636, filed on Nov. 15, 2021 and claims the priority of the Chinese patent application No. 202011505991.0, filed on Dec. 18, 2020, and entitled "DISPLAY PANEL, METHOD FOR MANUFACTURING SAME, AND ELECTRONIC DEVICE," the entire contents of which are incorporated herein by reference in their entireties.

TECHNICAL FIELD

The present disclosure relates to the field of display technology, and particularly, to a display panel, a method for manufacturing a display panel, and an electronic device.

BACKGROUND

At present, there are many antenna designs for electronic devices such as mobile phones, which are usually integrated in the back cover, the main board, or other positions. However, due to the thicker and more coils, these designs will easily affect the thickness and the space of the whole device. In addition, when the battery and the back cover are disassembled and assembled, it is easy to lead to the problems of wear or inaccurate alignment of the antenna wiring, which eventually cause deterioration of the antenna signal.

It should be noted that the above information disclosed in the BACKGROUND section is intended only to enhance the understanding of the background of the present disclosure, and may therefore include information that does not constitute prior art known to those of ordinary skill in the art.

SUMMARY

The purpose of the present disclosure is to provide a display panel, a method for manufacturing a display panel, and an electronic device.

According to a first aspect of the present disclosure, there is provided a display panel, which includes: a display functional layer with a display side and a back side opposite to each other; an antenna functional layer on the back side of the display functional layer, where the antenna function layer includes at least one antenna structure, and the at least one antenna structure includes: a first substrate, a power receiving coil on a side of the first substrate away from the display functional layer, and a first flat layer on a side of the power receiving coil away from the first substrate; and a magnetic field absorption layer on a side of the antenna functional layer close to the display functional layer or on a side of the antenna functional layer away from the display functional layer. An orthographic projection of the power receiving coil on a reference plane is within an orthographic projection of the magnetic field absorption layer on the reference plane, and the reference plane is a plane perpendicular to a thickness direction of the display panel.

According to a second aspect of the present disclosure, there is provided a method for manufacturing a display panel, which includes: providing a display functional layer with a display side and a back side; forming an antenna functional layer, where the antenna functional layer includes: a first substrate, a first conductive pattern layer on a side of the first substrate, and a first flat layer on a side of the first conductive pattern layer away from the first substrate, where the first conductive pattern layer includes at least one power receiving coil; forming a magnetic field absorption layer on a side of the first substrate away from the first conductive pattern layer, or on a side of the first flat layer away from the first conductive pattern layer; and integrating the antenna functional layer on the back side of the display functional layer, where the first substrate is closer to the display functional layer than the first conductive pattern layer. An orthographic projection of the power receiving coil on a reference plane is within an orthographic projection of the magnetic field absorption layer on the reference plane, and the reference plane is a plane perpendicular to a thickness direction of the display panel.

According to a third aspect of the present disclosure, there is provided an electronic device, which includes the display panel as described above and a flexible circuit board connected to the power receiving coil of the display panel.

It is to be understood that the foregoing general description and the following detailed description are exemplary and explanatory only, and are not intended to limit the present disclosure.

BRIEF DESCRIPTION OF THE DRAWINGS

The accompanying drawings, which are incorporated in and constitute a part of this specification, illustrate embodiments consistent with the present disclosure and are used in conjunction with the specification to explain the principles of this disclosure. Obviously, the drawings in the following description show only some embodiments of the present disclosure. For those of ordinary skill in the art, other drawings can also be obtained from these drawings without any creative effort.

DETAILED DESCRIPTION

The technical solutions of the present disclosure will be further specifically described below through the embodiments and in conjunction with the accompanying drawings. In the description, the same or similar reference numerals in the drawings denote the same or similar components. The following description of the embodiments of the present disclosure with reference to the accompanying drawings is intended to explain the general inventive concept of the present disclosure, and should not be construed as limitations to the present disclosure.

Furthermore, in the following detailed description, for convenience of explanation, numerous specific details are set forth in order to provide a thorough understanding of the embodiments of the present disclosure. However, it is apparent that one or more embodiments may be implemented without these specific details.

Unless otherwise defined, technical or scientific terms used in this disclosure shall have the ordinary meaning as understood by one of ordinary skill in the art to which the disclosure belongs. The terms "first," "second," and the like, as used in this disclosure, do not indicate any order, quantity, or importance, but are merely used to distinguish the various components.

Terms "including" or "having" or the like used in the disclosure mean that an element or item preceding the term covers an element or item enumerated after the term and its equivalent, without excluding other elements or items. The terms "connected" or "linked" or the like used in the present disclosure are not limited to physical or mechanical connections, but may also refer to electrical connections. Moreover, the terms "connected" or "linked" or the like used in the present disclosure may refer to direct connection or indirect connection.

Embodiments of the present disclosure provide a display panel, which may be a flexible panel, that is, the entire display panel may be bent so that the display panel can be suitable for various application scenarios, but not limited to this, the display panel may also be a rigid panel, namely, not conducive to bending, which depends on specific cases.

The display panels according to the embodiments of the present disclosure will be described in detail below with reference to the accompanying drawings.

Figure 1:
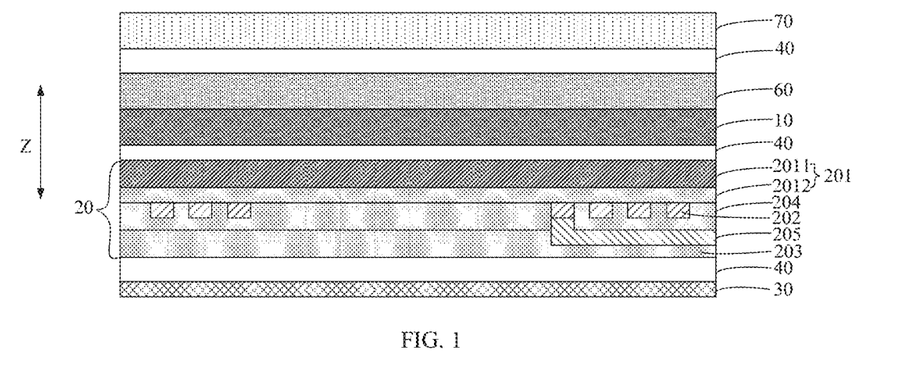
FIG. 1 illustrates a schematic structural diagram of a display panel according to the embodiments of the present disclosure.
Figure 2:
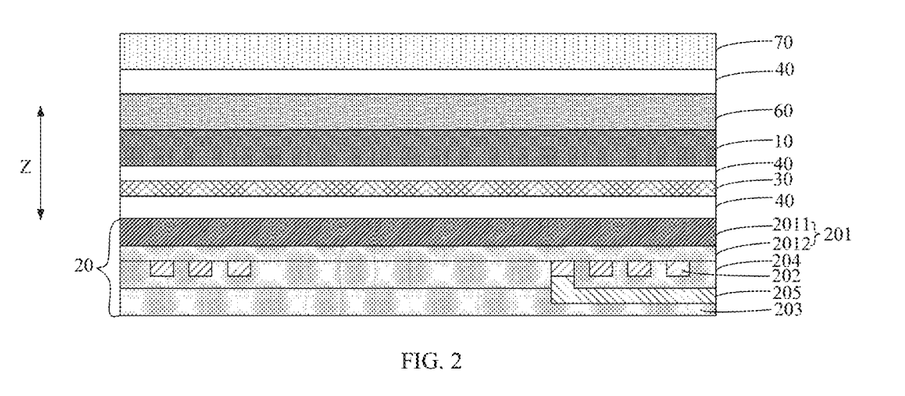
FIG. 2 illustrates a schematic structural diagram of a display panel according to be embodiments of the present disclosure.

As shown in FIG. 1 and FIG. 2, the display panel may include a display functional layer 10, an antenna functional layer 20 and a magnetic field absorption layer 30.

The display functional layer 10 may include a display side and a back side which are opposite to each other. It should be understood that the display side and the back side of the display functional layer 10 are oppositely arranged in the thickness direction Z of the entire display panel. For example, the display functional layer 10 may be an Organic Light-Emitting Diode (OLED) display, so that the entire display panel may have many advantages such as self-luminescence, high luminous efficiency, short response time, high definition and contrast ratio, and the good flexibility and adaptability of the entire display panel can also be ensured.

Figure 4:
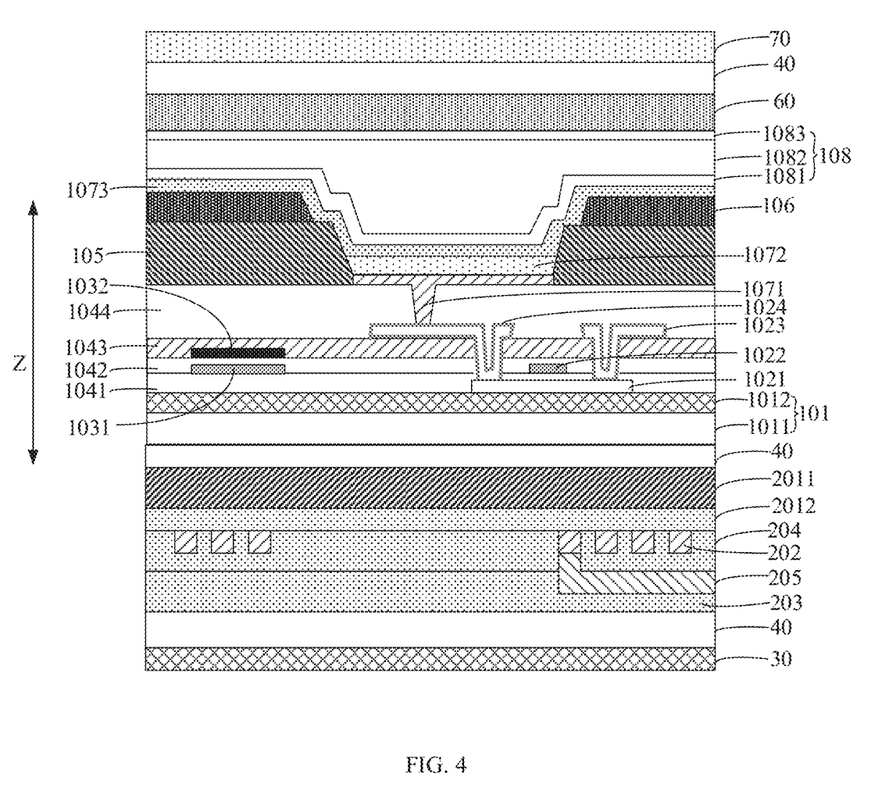
FIG. 4 illustrates a schematic structural diagram of a display panel according to the embodiments of the present disclosure.
Figure 5:
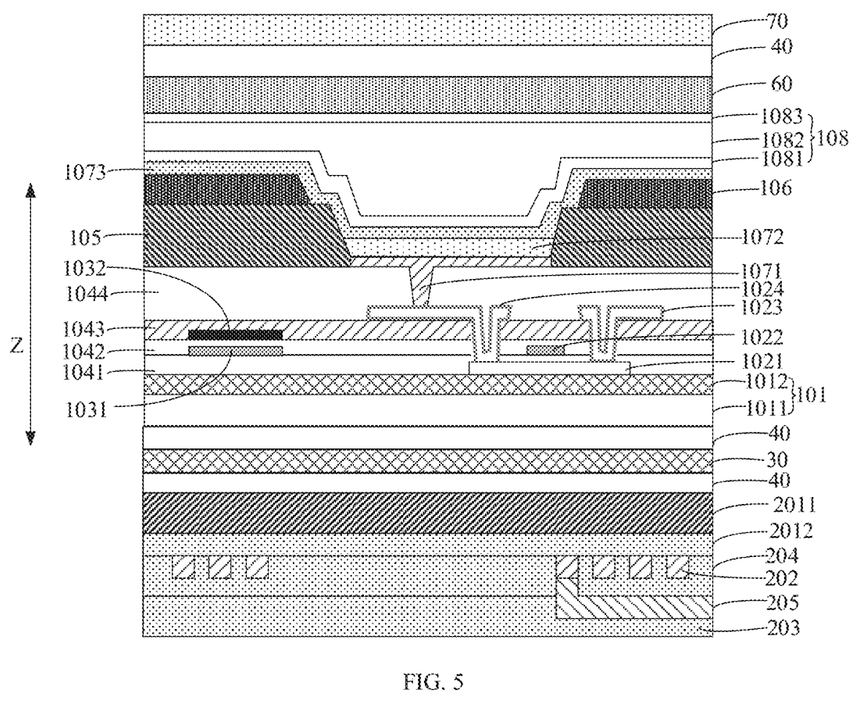
FIG. 5 illustrates a schematic structural diagram of a display panel according to the embodiments of the present disclosure.

Specifically, as shown in FIG. 4 and FIG. 5, the display functional layer 10 may include a second substrate 101, an organic light emitting display device, and an encapsulation film 108.

In the embodiments of the present disclosure, the second substrate 101 may be a single-layer structure or a multi-layer structure. When the second substrate 101 has a plurality of layers, the second substrate 101 includes a polyimide (PI) layer 1011 and an inorganic buffer layer 1012 stacked in layers. The inorganic butter layer 1012 may be made of silicon nitride, silicon oxide and other materials to achieve the effect of blocking water and oxygen and blocking alkaline ions. In this way, the effect of blocking water and oxygen and blocking alkaline ions can be achieved while ensuring good flexibility of the second substrate 101.

The organic light emitting display device may be formed on the second substrate 101. It should be understood that, when the second substrate 101 includes the polyimide layer 1011 and the inorganic buffer layer 1012 that are stacked in layers, the organic light emitting display device may be formed on the side of the inorganic buffer layer 1012 away from the polyimide layer 1011. In addition, the organic light emitting display device may include a driving circuit layer and an organic light emitting layer.

In embodiments of the present disclosure, the driving circuit layer may include a thin film transistor, a storage capacitor, and insulating stacked layers provided in the entire layer. The thin film transistor may include an active layer 1021, a gate electrode 1022, a source electrode 1023 and a drain electrode 1024. As shown in FIG. 4 and FIG. 5, the thin film transistor may be a top-gate type, that is, the gate electrode 1022 of the thin film transistor is located on the side of the active layer 1021 away from the second substrate 101. The storage capacitor may include a first plate 1031 and a second plate 1032. The first plate 1031 and the gate electrode 1022 may be arranged on the same layer, and the second plate 1032 is opposite to the first plate 1031 and is located on the side of the first plate 1031 away from the second substrate 101. The insulating stacked layers may include a first gate insulating layer 1041 between the gate electrode 1022 and the active layer 1021, a second gate insulating layer 1042 between the source/drain electrode and gate electrode 1022 and between the first plate 1031 and the second plate 1032, an interlayer dielectric layer 1043 located between the source/drain electrode and the second plate 1032, and a second flat layer 1044 covering the source electrode 1023 and the drain electrode 1024. It should be understood that the source electrode 1023 and the drain electrode 1024 may contact opposite ends of the active layer 1021 through via holes penetrating through the interlayer dielectric layer 1043, the second gate insulating layer 1042 and the first gate insulating layer 1041, respectively.

It should be noted that, the driving circuit layer is not limited to the structure mentioned above, but depends on specific cases. In addition, it should be noted that the aforementioned active layer 1021 may be amorphous silicon (a-Si), low temperature polysilicon (LTPS), or indium gallium zinc oxide (IGZO), etc., but not limited thereto, which depends on specific cases.

For example, the materials of the gate electrode 1022, the first electrode plate 1031, and the second plate 1032 may include metal materials or alloy materials, such as molybdenum, aluminum, titanium, copper, niobium alloy, and the like. The materials of the source electrode 1023 and the drain electrode 1024 may include metal materials or alloy materials, such as metal single-layer or multi-layer structures formed of molybdenum, aluminum, titanium, etc. For example, the multi-metal structure is a multi-metal stack of layers, such as titanium, aluminum, titanium three-layer metal stack (Al/Ti/Al), and the like.

As shown in FIG. 4 and FIG. 5, the organic light emitting layer may include an anode 1071 formed on the second flat layer 1044, a pixel definition layer 105 with pixel openings formed on the second flat layer 1044, photo spacers (PS) 106 formed on the pixel definition layer 105, organic light-emitting material 1072 located in the pixel openings and formed on the anode 1071, and a cathode 1073 entirely covering the pixel definition layer 105, the photo spacers 106 and the organic light-emitting material 1072.

As shown in FIG. 4 and FIG. 5, the encapsulation film 108 is formed on the side of the organic light emitting display device away from the second substrate 101. For example, the encapsulation film 108 may include a first inorganic encapsulation layer 1081, an organic encapsulation layer 1082 and a second inorganic encapsulation layer 1083 which are stacked in sequence.

Figure 6:
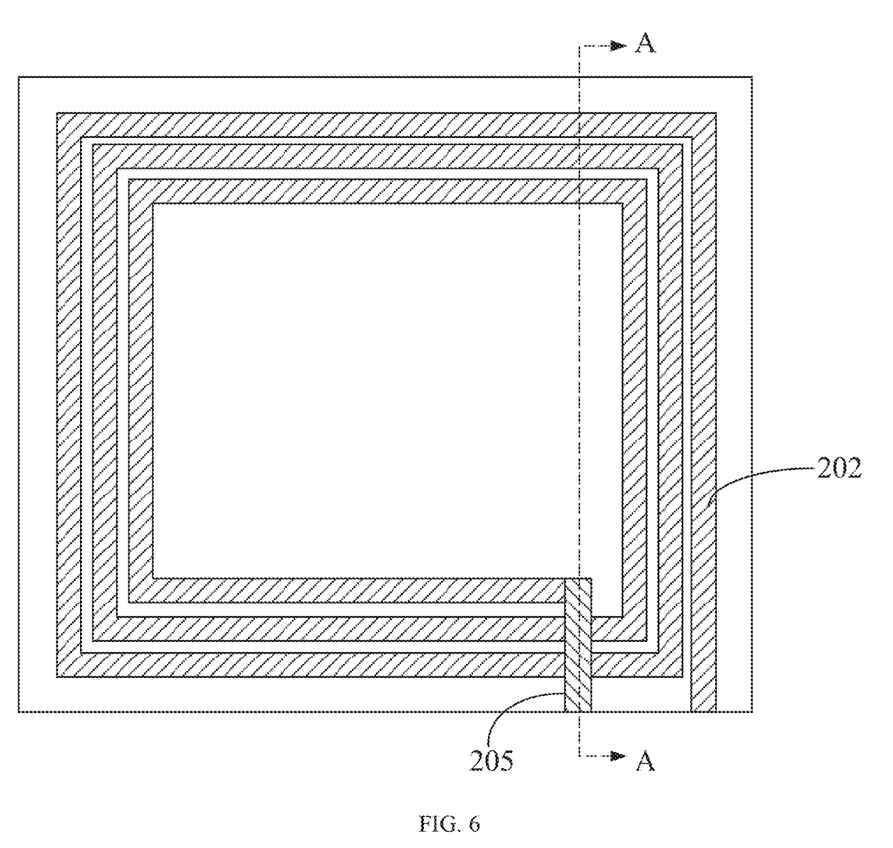
FIG. 6 illustrates a schematic plan view of an antenna functional layer in a display panel according to embodiments of the present disclosure.
Figure 7:
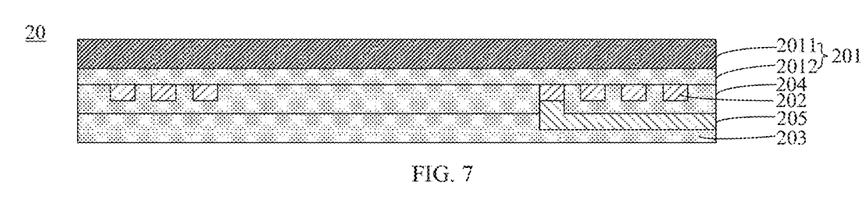
FIG. 7 illustrates a schematic diagram of a cross-sectional structure of the antenna functional layer in FIG. 6 along the line A-A.
Figure 8:
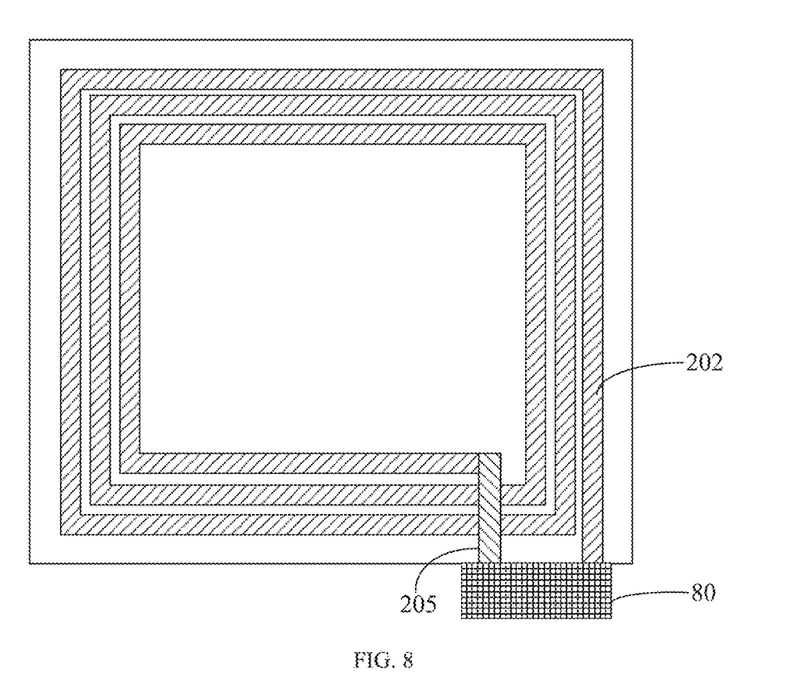
FIG. 8 illustrates a schematic diagram of a connection relationship between an antenna functional layer and a flexible circuit board in a display panel according to the embodiments of the present disclosure.

The antenna functional layer 20 may be formed on the back side of the display functional layer 10. In the embodiments of the present disclosure, as shown in FIG. 6 and FIG. 7, the antenna functional layer 20 may include at least one antenna structure, and the antenna structure includes a first substrate 201, a power receiving coil 202 on the side of the first substrate 201 away from the display functional layer 10, and a first flat layer 203 on the side of the power receiving coil 202 away from the first substrate 201. For example, as shown in FIG. 4 and FIG. 5, the first substrate 201 may be bonded to the second substrate 101 through the optical adhesive layer 40. It should be understood that the first flat layer 203 may cover the power receiving coil 202, and the power receiving coil 202 may be connected to the flexible circuit board 80, as shown in FIG. 8. The flexible circuit board 80 may include a circuit for realizing wireless signal transmission function, but is not limited thereto, the power receiving coil 202 may also be connected to the binding area of the display functional layer or directly connected to the mainboard, etc.

In the embodiments of the present disclosure, by integrating the antenna structure into the display panel, that is, making the display panel as a whole as a transmitting source or a receiving source, compared to the existing solution of arranging the antenna structure on the back cover and the mainboard, the space at the main board and the back cover can be saved and the design of other structures of the whole device can thereby be facilitated. In addition, it can also avoid the case that the junction of the antenna is easily worn and dislocated when the battery and the back cover are disassembled and assembled, thereby improving the performance of the antenna.

In the embodiments of the present disclosure, the first substrate 201 may be a single-layer structure or a multi-layer structure. For example, as shown in FIG. 7, the first substrate 201 may include an organic insulating layer 2011 and a first inorganic insulating layer 2012 located on a side of the organic insulating layer 2011 away from the display functional layer 10.

As shown in FIG. 6 and FIG. 7, the antenna structure may further include a second inorganic insulating layer 204 and a connecting lead 205. The second inorganic insulating layer 204 is located between the first flat layer 203 and the power receiving coil 202. The connecting lead 205 is located between the second inorganic insulating layer 204 and the first flat layer 203, one end of the connecting lead 205 is connected to an end of the power receiving coil 202 through a via hole penetrating the second inorganic insulating layer 204, and the other end of the connecting lead 205 is connectable to a flexible circuit board 80.

For example, the materials of the organic insulating layer 2011 and the first flat layer 203 of the antenna functional layer 20 may be organic polymer materials such as PI or acrylate, and the materials of the first inorganic insulating layer 2012 and the second inorganic insulating layer 204 may be inorganic materials such as silicon oxide and silicon nitride. The materials of the power receiving coil 202 and the connecting lead 205 may include materials with high conductivity and low square resistance such as copper (Cu), silver (Ag), and graphene.

Optionally, as shown in FIG. 6, the power receiving coil 202 may be in a shape of a plane spiral, for example, it may be in a rectangular spiral shape as shown in FIG. 6, but not limited thereto, or it may be in a circular spiral shape, an elliptical spiral shape, etc., or in some other shape, e.g., a snake shape, etc. It should be understood that, when the power receiving coil 202 is in a plane spiral shape, the inner end of the power receiving coil 202 may be connected to the flexible circuit board 80 by being connected with a connecting lead 205. In the embodiments of the present disclosure, the inner end of the power receiving coil 202 is connected to the flexible circuit board 80 through the connecting lead 205 in other layers, compared to connecting the flexible circuit board through the lead arranged on the same layer with the power receiving coil 202, which can reduce the design and processing difficulty of the lead and reduce the cost while ensuring the stable connection between the power receiving coil 202 and the flexible circuit board 80, and also avoid the contact of the lead with each turn of the power receiving coil 202 during the manufacturing process of the lead to ensure that the performance of the power receiving coil 202 can meet the requirements. In addition, the outer end of the power receiving coil 202 may also be connected to the flexible circuit board 80 by connecting to a connecting lead 205, but without limitation, the outer end of the power receiving coil 202 may also be connected to the flexible circuit board 80 by a lead arranged on the same layer with the power receiving coil 202.

In order to improve the performance of the antenna structure, the inductance of the power receiving coil 202 in the embodiments of the present disclosure may be designed to be greater than or equal to 0.3 uh. For example, when the power receiving coil 202 is in a plane spiral shape, the line width of the power receiving coil 202 may be designed to be less than or equal to 5 mm, such as 5 mm, 4 mm, 3 mm, 2 mm, 1 mm, etc., and the spacing between two adjacent turns in the power receiving coil 202 may be designed to range from 0.1 mm to 1 mm, such as 0.1 mm, 0.4 mm, 0.7 mm, 1 mm, etc., which can reduce the difficulty of processing while ensuring the antenna performance.

In the embodiments of the present disclosure, the thickness of the organic insulating layer 2011 of the antenna functional layer 20 may range from 10 μm to 50 μm, such as 10 μm, 20 μm, 30 μm, 40 μm, 50 μm, etc.; the thickness of the first inorganic insulating layer 2012 and the thickness of the second inorganic insulating layer 204 may be less than or equal to 2 μm, such as 0.5 μm, 1 μm, 1.5 μm, 2 μm, etc.; the thickness of the power receiving coil 202 and the thickness of the connecting lead 205 may be less than or equal to 1 μm, such as 0.2 μm, 0.5 μm, 0.8 μm, 3 μm, etc.; and the thickness of the first flat layer 203 may be less than or equal to 5 μm, such as 1 μm, 2 μm, 3 μm, 4 μm, 5 μm, etc.

These designs can ensure the performance of the antenna while ensuring a thinner display panel.

For example, the antenna structure in the antenna functional layer 20 may include a wireless charging antenna structure and/or a Near Field Communication (NFC) antenna structure, but is not limited thereto, and may also include other antenna structures. It should be understood that when the antenna functional layer 20 includes a plurality of antenna structures. For example, when the wireless charging antenna structure and the NFC antenna structure are included at the same time, the power receiving coil 202 of the wireless charging antenna structure and the power receiving coil 202 of the NFC antenna structure are arranged on the same layer and are disconnected from each other, and the connecting lead 205 of the wireless charging antenna structure and the connecting lead 205 of the NFC antenna structure are arranged on the same layer and are disconnected from each other.

Figure 3:
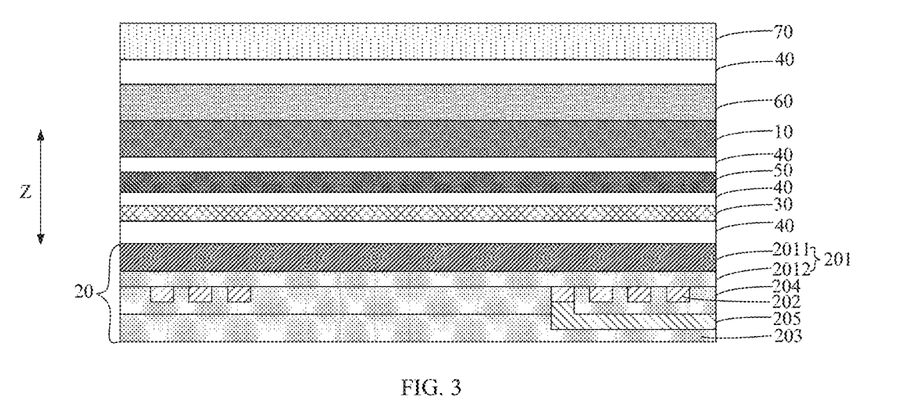
FIG. 3 illustrates a schematic structural diagram of a display panel according to the embodiments of the present disclosure.

As shown in FIG. 2, FIG. 3 and FIG. 5, the magnetic field absorption layer 30 may be formed on the side of the antenna functional layer 20 close to the display functional layer 10, or formed on the side of the antenna functional layer 20 away from the display functional layer 10 as shown in FIG. 1 and FIG. 4. Specifically, the magnetic field absorption layer 30 may be bonded to the side of the first flat layer 203 of the antenna functional layer 20 away from the display functional layer 10 through the optical adhesive layer 40, or two sides of the magnetic field absorption layer 30 are respectively bonded to the first substrate 201 and the second substrate 101 through the optical adhesive layer 40.

It should be understood that, as shown in FIG. 1 and FIG. 4, the magnetic field absorption layer 30 may be formed on the side of the antenna functional layer 20 away from the display functional layer 10 when the magnetic field is transmitted from the display side of the entire display panel for interaction. As shown in FIG. 2, FIG. 3 and FIG. 5, the magnetic field absorption layer 30 may be formed on the side of the antenna functional layer 20 close to the display functional layer 10 when the magnetic field is transmitted from the back side of the entire display panel for interaction. It should be understood that an orthographic projection of the aforementioned power receiving coil 202 on the reference plane should be located within the orthographic projection of the magnetic field absorption layer 30 on the reference plane. The reference plane is a plane perpendicular to the thickness direction Z of the display panel.

In the embodiments of the present disclosure, the magnetic field absorption layer 30 is provided to reduce the eddy current effect caused by the magnetic field affecting other metals or related components, thereby improving the utilization rate of the magnetic field and the magnetic induction intensity, so that the antenna performance can be improved.

Optionally, the magnetic permeability of the magnetic field absorption layer 30 may be greater than 150 at 13.56 Mhz, and its magnetic loss may be less than 100 at 13.56 Mhz when designing the magnetic field absorption layer 30 in order to improve the utilization rate of the magnetic field and the magnetic induction intensity.

For example, the magnetic field absorption layer 30 may include a ferrite film layer or an amorphous film layer, that is, the material of the magnetic field absorption layer 30 may be ferrite material or amorphous material. Optionally, the magnetic field absorption layer 30 may be an amorphous film layer, and the amorphous film layer may further be an iron-based amorphous film layer to improve its magnetic permeability. In addition, the iron-based amorphous film layer may also have good bending properties.

In the embodiments of the present disclosure, the thickness of the iron-based amorphous film layer may range from 20 μm to 40 μm, such as 20 μm, 25 μm, 30 μm, 35 μm, 40 μm, etc. On the one hand, this design can avoid the situation that the iron-based amorphous film layer is too thin and leads to poor magnetic permeability, and on the other hand, it can avoid the situation that the iron-based amorphous film layer is too thick and leads to poor bending performance. In other words, by designing the thickness of the iron-based amorphous film layer to range from 20 μm to 40 μm, the magnetic permeability can be guaranteed and the bending can be facilitated at the same time, so that the iron-based amorphous film layer can be easily applied to flexible display products. For example, in an experimental test, the iron-based amorphous film layer was bent with a bending radius of 3 mm at a thickness of 20 μm, and no breakage (Crack) was observed after 200 times of bending.

In the embodiments of the present disclosure, as shown in FIG. 3, the display panel may further include a support film 50. The two sides of the support film 50 may be respectively bonded to the first substrate 201 of the antenna functional layer 20 and the second substrate 101 of the display functional layer 10 through the optical adhesive layer 40. The overall structural strength of the display panel can be ensured by providing the support film 50. It should be understood that the display panel of the present disclosure may not be provided with the support film 50, as shown in FIG. 1, FIG. 2, FIG. 4, and FIG. 5, which depends on the specific cases.

In addition, as shown in FIG. 1 to FIG. 5, the display panel may further include a module functional layer 60 and a cover plate 70. The module functional layer 60 may be formed on side of the encapsulation film 108 away from the organic light-emitting display device, and may include at least a touch functional layer and a polarizer stacked in the thickness direction Z of the display panel. It should be understood that the polarizer may be located on the side of the touch functional layer away from the display functional layer 10, and the polarizer may be a circular polarizer to reduce reflection and improve display effect. The cover plate 70 may be formed on a side of the module functional layer 60 away from the display functional layer 10. In an example, the cover plate 70 may be made of organic polymer material, and the cover plate 70 may have a certain flexibility to ensure the bending performance of the entire display panel.

In this disclosure, unless otherwise specified, the term "arranged on the same layer" is used to mean that two layers, members, components, elements or parts may be formed by the same patterning process, and that the two layers, members, components, elements or parts are generally formed of the same material.

In this disclosure, unless otherwise specified, the expression "patterning process" generally includes steps of coating the photoresist, exposure, development, etching, stripping of the photoresist, and so on. The expression "one-time patterning process" refers to a process that uses a single mask to form patterned layers, members, components, etc.

Figure 9:
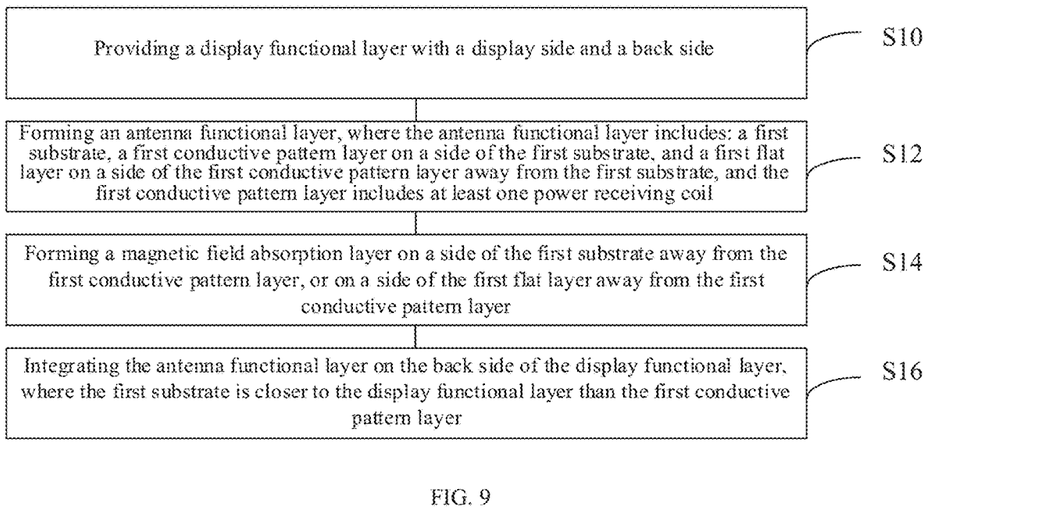
FIG. 9 illustrates a flowchart of a method for manufacturing a display panel according to embodiments of the present disclosure.

The embodiments of the present disclosure further provide a method for manufacturing a display panel. The display panel may have the structure described in any of the foregoing embodiments, as shown in FIG. 1 to FIG. 7, which will not be repeated herein. As shown in FIG. 9, the method for manufacturing the display panel may include the following steps.

Step S10, providing a display functional layer with a display side and a back side.

Step S12, forming an antenna functional layer, where the antenna functional layer includes: a first substrate, a first conductive pattern layer on a side of the first substrate, and a first flat layer on a side of the first conductive pattern layer away from the first substrate, and the first conductive pattern layer includes at least one power receiving coil.

Step S14, forming a magnetic field absorption layer on a side of the first substrate away from the first conductive pattern layer, or on a side of the first flat layer away from the first conductive pattern layer.

Step S16, integrating the antenna functional layer on the back side of the display functional layer, where the first substrate is closer to the display functional layer than the first conductive pattern layer.

Here, an orthographic projection of the power receiving coil on a reference plane is within an orthographic projection of the magnetic field absorption layer on the reference plane, and the reference plane is a plane perpendicular to a thickness direction of the display panel.

It should be noted that the magnetic field absorption layer in the embodiments of the present disclosure may be formed on the antenna functional layer first, and then integrated on the back side of the display functional layer in its entirety, without any limitation. It may also be formed on the back side of the display functional layer before the antenna functional layer is integrated on the back side of the display functional layer, or it may be formed on the side of the antenna functional layer away from the display functional layer after the antenna functional layer is integrated on the back side of the display functional layer.

In some examples, the magnetic field absorption layer, the display functional layer and the antenna functional layer in the embodiments of the present disclosure may be connected by bonding, e.g., an optical adhesive layer may be used to bond the magnetic field absorption layer, the display functional layer and the antenna functional layer to each other.

Figure 10:
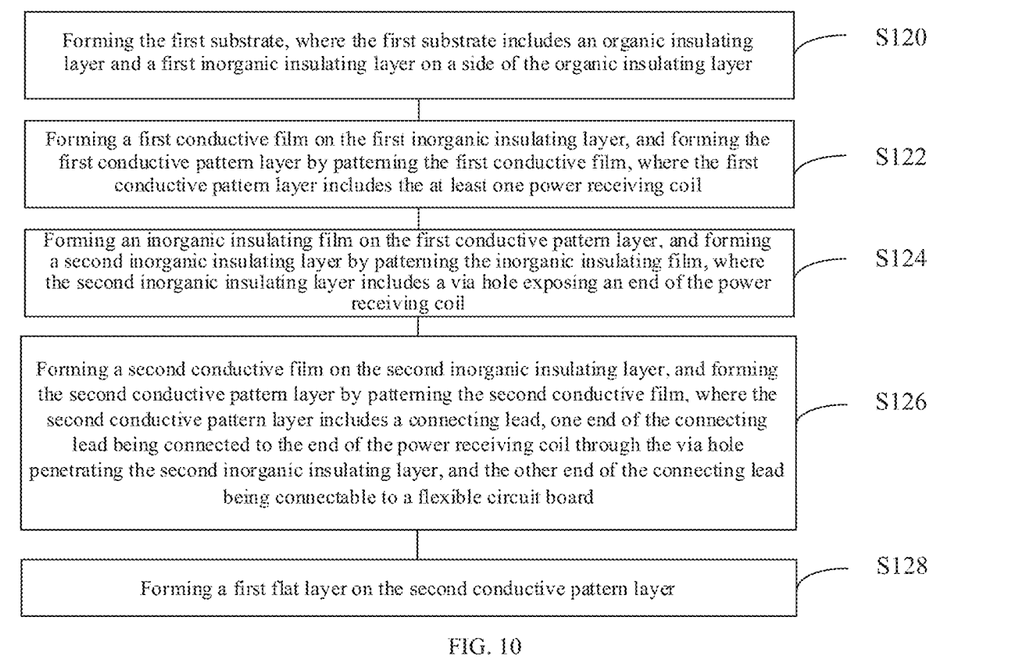
FIG. 10 illustrates a flowchart of step S12 in the manufacturing method in FIG. 9.

Optionally, as shown in FIG. 10, the step S12 of forming an antenna functional layer 20 may include the following steps.

Figure 11:
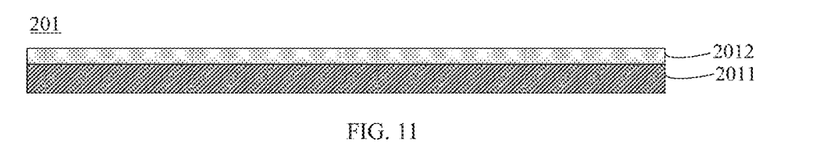
FIG. 11 illustrates a schematic structural diagram after completing step S120.

Step S120, forming the first substrate 201, where the first substrate 201 may include an organic insulating layer 2011 and a first inorganic insulating layer 2012 on a side of the organic insulating layer 2011, as shown in FIG. 11.

Figure 12:
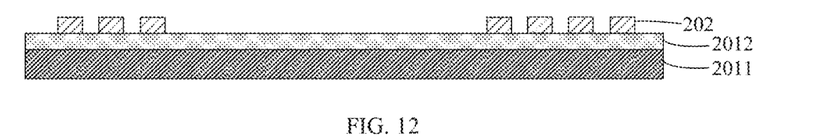
FIG. 12 illustrates a schematic structural diagram after completing step S122.

Step S122, forming a first conductive film on the first inorganic insulating layer 2012, and forming the first conductive pattern layer by patterning the first conductive film, where the first conductive pattern layer includes the at least one power receiving coil 202, as shown in FIG. 12. In some examples, the first conductive film can be formed on the first inorganic insulating layer 2012 by a process such as electroplating or sputtering.

Figure 13:
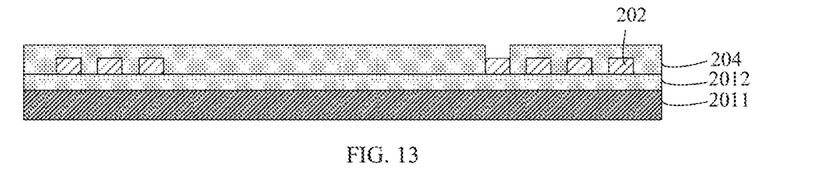
FIG. 13 illustrates a schematic structural diagram after completing step S124.

Step S124, forming an inorganic insulating film on the first conductive pattern layer, and forming a second inorganic insulating layer 204 by patterning the inorganic insulating film, where the second inorganic insulating layer 204 includes a via hole exposing an end of the power receiving coil 202, as shown in FIG. 13. The patterning process mentioned in the embodiments of the present disclosure may, for example, be a photolithography process such as exposure and development.

Figure 14:
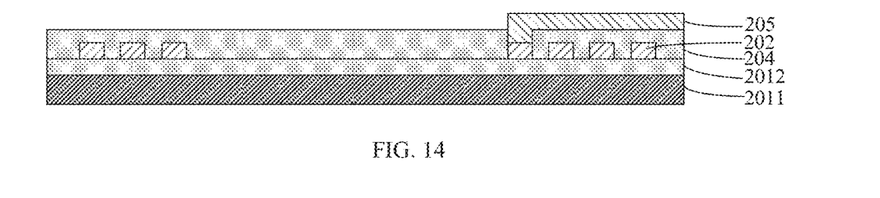
FIG. 14 illustrates a schematic structural diagram after completing step S126.

Step S126, forming a second conductive film on the second inorganic insulating layer 204, and forming the second conductive pattern layer by patterning the second conductive film, where the second conductive pattern layer includes a connecting lead 205, one end of the connecting lead 205 being connected to the end of the power receiving coil 202 through the via hole penetrating the second inorganic insulating layer 204, and the other end of the connecting lead 205 being connectable to a flexible circuit board 80, as shown in FIG. 14.

Step S128, forming a first flat layer 203 on the second conductive pattern layer, as shown in FIG. 7.

It should be understood that the antenna functional layer 20 in the embodiments of the present disclosure is not limited to the aforementioned film layers, and may also include other film layers, for example, an inorganic insulating layer or the like may also be provided between the first flat layer 203 and the second conductive pattern layer, which depends on specific cases.

It should be noted that although the steps of the method for manufacturing the display panel in the present disclosure are described in a specific order in the drawings, it is not required or implied that the steps must be performed in this particular order, or that all illustrated steps must be performed to achieve desired results. Additionally or alternatively, certain steps may be omitted, multiple steps may be combined into one step for execution, and/or one step may be decomposed into multiple steps for execution, etc.

The embodiments of the present disclosure further provide an electronic device, which includes the display panel described in any of the foregoing embodiments, and a flexible circuit board 80 connected to the power receiving coil 202 of the display panel.

It should be noted that, in addition to the aforementioned display panel and flexible circuit board 80, the electronic device may also include other members and components, such as batteries, mainboard, housings, etc. Those skilled in the art may make corresponding supplements according to the specific usage requirements of the electronic device, which will not be repeated here.

In the embodiments of the present disclosure, the specific type of electronic device is not particularly limited, and any type of electronic device commonly used in the art may be used, such as televisions, mobile phones, computers, medical equipment, etc. Those skilled in the art may make corresponding selections according to the specific use of the electronic device, which will not be repeated here.

Other implementation solutions of the present disclosure will readily come to the mind of those skilled in the art upon consideration of the specification and practice of the invention disclosed herein. The present disclosure is intended to cover any variations, uses, or adaptations of the present disclosure that follow the general principles of the present disclosure and include common general knowledge or customary technical means in the art that are not disclosed herein. The specification and embodiments are to be considered exemplary only, and the true scope and spirit of the present disclosure is indicated by the appended claims.

What is claimed is:

1. A display panel, comprising:
a display functional layer with a display side and a back side opposite to each other;
an antenna functional layer on the back side of the display functional layer, wherein the antenna functional layer comprises at least one antenna structure, and the at least one antenna structure comprises:
a first substrate,
a power receiving coil on a side, away from the display functional layer, of the first substrate, and
a first flat layer on a side, away from the first substrate, of the power receiving coil; and
a magnetic field absorption layer on a side, close to the display functional layer, of the antenna functional layer, or on a side, away from the display functional layer, of the antenna functional layer;

wherein an orthographic projection of the power receiving coil on a reference plane is within an orthographic projection of the magnetic field absorption layer on the reference plane, and the reference plane is a plane perpendicular to a thickness direction of the display panel.

2. The display panel according to claim 1, wherein
the first substrate comprises an organic insulating layer and a first inorganic insulating layer on a side, away from the display functional layer, of the organic insulating layer; and
the antenna structure further comprises:
 a second inorganic insulating layer between the first flat layer and the power receiving coil; and
 a connecting lead between the second inorganic insulating layer and the first flat layer, one end of the connecting lead being connected to an end of the power receiving coil through a via hole penetrating the second inorganic insulating layer, and the other end of the connecting lead being connectable to a flexible circuit board.

3. The display panel according to claim 2, wherein the power receiving coil is in a plane spiral shape, and an inner end of the power receiving coil is connected to the connecting lead.

4. The display panel according to claim 3, wherein
a line width of the power receiving coil is less than or equal to 5 mm, and a distance between two adjacent turns of the power receiving coil ranges from 0.1 mm to 1 mm.

5. The display panel according to claim 2, wherein
a thickness of the organic insulating layer ranges from 10 μm to 50 μm;
a thickness of the first inorganic insulating layer is less than or equal to 2 μm;
a thickness of the second inorganic insulating layer is less than or equal to 2 μm;
a thickness of the power receiving coil is less than or equal to 1 μm;
a thickness of the connecting lead is less than or equal to 1 μm; and
a thickness of the first flat layer is less than or equal to 5 μm.

6. The display panel according to claim 1, wherein
a material of the power receiving coil comprises one of: copper, silver, and graphene; and
the magnetic field absorption layer comprises a ferrite film layer or an amorphous film layer.

7. The display panel according to claim 6, wherein the amorphous film layer is an iron-based amorphous film layer, and a thickness of the iron-based amorphous film layer ranges from 20 μm to 40 μm.

8. The display panel according to claim 1, wherein
an inductance of the power receiving coil is greater than or equal to 0.3 uh; and
a magnetic permeability of the magnetic field absorption layer is greater than 150 at 13.56 Mhz, and a magnetic loss of the magnetic field absorption layer is less than 100 at 13.56 Mhz.

9. The display panel according to claim 1, wherein the at least one antenna structure comprises at least one of: a wireless charging antenna structure, and a Near-Field Communication (NFC) antenna structure.

10. The display panel according to claim 1, wherein the display functional layer comprises:
 a second substrate bonded to the first substrate through an optical adhesive layer;
 an organic light-emitting display device on a side, away from the first substrate, of the second substrate; and
 an encapsulation film on a side, away from the second substrate, of the organic light-emitting display device; and
wherein the magnetic field absorption layer is bonded to a side, away from the display functional layer, of the first flat layer through an optical adhesive layer, or two sides of the magnetic field absorption layer are respectively bonded to the first substrate and the second substrate through an optical adhesive layer.

11. The display panel according to claim 10, further comprising:
 a support film, two sides of which are respectively bonded to the first substrate and the second substrate through an optical adhesive layer;
 a module functional layer on a side, away from the organic light-emitting display device, of the encapsulation film, wherein the module functional layer comprises at least a touch functional layer and a polarizer stacked in the thickness direction of the display panel; and
 a cover plate on a side, away from the display functional layer, of the module functional layer.

12. The display panel according to claim 1, wherein the display panel is a flexible panel and is bendable.

13. A method for manufacturing a display panel, comprising:
 providing a display functional layer with a display side and a back side;
 forming an antenna functional layer, wherein the antenna functional layer comprises:
  a first substrate,
  a first conductive pattern layer on a side of the first substrate, wherein the first conductive pattern layer comprises at least one power receiving coil, and
  a first flat layer on a side, away from the first substrate, of the first conductive pattern layer;
 forming a magnetic field absorption layer on a side, away from the first conductive pattern layer, of the first substrate, or on a side, away from the first conductive pattern layer, of the first flat layer; and
 integrating the antenna functional layer on the back side of the display functional layer, wherein the first substrate is closer to the display functional layer than the first conductive pattern layer;
wherein an orthographic projection of the power receiving coil on a reference plane is within an orthographic projection of the magnetic field absorption layer on the reference plane, and the reference plane is a plane perpendicular to a thickness direction of the display panel.

14. The method according to claim 13, wherein the forming the antenna functional layer comprises:
 forming the first substrate, wherein the first substrate comprises an organic insulating layer and a first inorganic insulating layer on a side of the organic insulating layer;
 forming a first conductive film on the first inorganic insulating layer, and forming the first conductive pattern layer by patterning the first conductive film, wherein the first conductive pattern layer comprises the at least one power receiving coil;
 forming an inorganic insulating film on the first conductive pattern layer, and forming a second inorganic insulating layer by patterning the inorganic insulating film, wherein the second inorganic insulating layer comprises a via hole exposing an end of the power receiving coil;

forming a second conductive film on the second inorganic insulating layer, and form a second conductive pattern layer by patterning the second conductive film, wherein the second conductive pattern layer comprises a connecting lead, one end of the connecting lead being connected to the end of the power receiving coil through the via hole penetrating the second inorganic insulating layer, and the other end of the connecting lead being connectable to a flexible circuit board; and forming a first flat layer on the second conductive pattern layer.

15. An electronic device, comprising a display panel and a flexible circuit board connected to a power receiving coil of the display panel, wherein the display panel comprises:
a display functional layer with a display side and a back side opposite to each other;
an antenna functional layer on the back side of the display functional layer, wherein the antenna functional layer comprises at least one antenna structure, and the at least one antenna structure comprises:
a first substrate,
a power receiving coil on a side, away from the display functional layer, of the first substrate, and
a first flat layer on a side, away from the first substrate, of the power receiving coil; and
a magnetic field absorption layer on a side, close to the display functional layer, of the antenna functional layer, or on a side, away from the display functional layer, of the antenna functional layer;
wherein an orthographic projection of the power receiving coil on a reference plane is within an orthographic projection of the magnetic field absorption layer on the reference plane, and the reference plane is a plane perpendicular to a thickness direction of the display panel.

16. The electronic device according to claim 15, wherein the first substrate comprises an organic insulating layer and a first inorganic insulating layer on a side, away from the display functional layer, of the organic insulating layer; and
the antenna structure further comprises:
a second inorganic insulating layer between the first flat layer and the power receiving coil; and
a connecting lead between the second inorganic insulating layer and the first flat layer, one end of the connecting lead being connected to an end of the power receiving coil through a via hole penetrating the second inorganic insulating layer, and the other end of the connecting lead being connectable to a flexible circuit board.

17. The electronic device according to claim 16, wherein the power receiving coil is in a plane spiral shape, and an inner end of the power receiving coil is connected to the connecting lead.

18. The electronic device according to claim 15, wherein
a material of the power receiving coil comprises one of: copper, silver, and graphene; and
the magnetic field absorption layer comprises a ferrite film layer or an amorphous film layer.

19. The electronic device according to claim 15, wherein the at least one antenna structure comprises at least one of: a wireless charging antenna structure, and a Near-Field Communication (NFC) antenna structure.

20. The electronic device according to claim 15, wherein the display functional layer comprises:
a second substrate bonded to the first substrate through an optical adhesive layer;
an organic light-emitting display device on a side, away from the first substrate, of the second substrate; and
an encapsulation film on a side, away from the second substrate, of the organic light-emitting display device; and
wherein the magnetic field absorption layer is bonded to a side, away from the display functional layer, of the first flat layer through an optical adhesive layer, or two sides of the magnetic field absorption layer are respectively bonded to the first substrate and the second substrate through an optical adhesive layer.

* * * * *